(12) United States Patent
Tseng

(10) Patent No.: US 6,341,935 B1
(45) Date of Patent: Jan. 29, 2002

(54) WAFER BOAT HAVING IMPROVED WAFER HOLDING CAPABILITY

(75) Inventor: Heng-Yi Tseng, Hsin-Chu (TW)

(73) Assignee: Taiwan Semiconductor Manufacturing Company, Ltd., Hsin Chu (TW)

(*) Notice: Subject to any disclaimer, the term of this patent is extended or adjusted under 35 U.S.C. 154(b) by 0 days.

(21) Appl. No.: 09/593,674

(22) Filed: Jun. 14, 2000

(51) Int. Cl.$^7$ ............................................. B65G 29/00
(52) U.S. Cl. ...................... 414/800; 414/938; 118/500; 211/41.18; 206/712
(58) Field of Search ............................. 414/217.1, 800, 414/811, 799; 118/500, 900; 211/41.18; 206/710–712

(56) References Cited

U.S. PATENT DOCUMENTS 5,858,103 A * 1/1999 Nakajima et al. ........... 118/500
6,092,981 A * 7/2000 Pfeiffer et al. .............. 414/811

* cited by examiner

Primary Examiner—Joseph E. Valenza
(74) Attorney, Agent, or Firm—Tung & Associates

(57) ABSTRACT

A wafer boat for securely holding wafers therein during processing in a vertical furnace and a method for loading dummy wafers into a wafer boat without having to remove/reload for each oxidation process have been disclosed. In the wafer boat, a plurality of cavities are formed by horizontal notches in support posts together with horizontal ridges that are integrally formed with the support posts. A raised portion extending upwardly from a top surface of the horizontal ridge such that any possible outward movements of the dummy wafer, even after repeated loading/unloading operations, from the cavity can be prevented. A suitable height of the raised portion is between about 0.2 mm and about 2 mm, a more preferred range for the height is between about 0.2 mm and about 0.5 mm.

16 Claims, 2 Drawing Sheets

WAFER BOAT HAVING IMPROVED WAFER HOLDING CAPABILITY

FIELD OF THE INVENTION

The present invention generally relates to a wafer boat for holding wafers in a vertical furnace during an oxidation process and more particularly, relates to a wafer boat that has improved wafer holding capability during an oxidation process in a vertical furnace such that the necessity of loading and unloading dummy wafers from the boat for each oxidation process can be avoided.

BACKGROUND OF THE INVENTION

In connection with processes used to manufacture semiconductor devices, such as integrated circuits, numerous process steps are carried out in a controlled environment at elevated temperatures. Such processes includes oxidation, diffusion, chemical vapor deposition and annealing. In order to realize elevated processing temperatures, semiconductor wafers are processed in an evacuated chamber, typically in a form of a quartz tube which is housed within a semiconductor furnace.

The most common type of semiconductor furnace is of the "hot wall" electric type which facilitates batch processing of semiconductor wafers. Furthermore, hot wall electric furnaces exhibit excellent temperature stability and precise temperature control. Modern hot wall diffusion furnaces are capable of controlling temperatures over the range of 300° C. –1200° C. to an accuracy of ±0.50° C. Hot wall furnaces were initially designed as horizontal diffusion furnaces, however, more recently, vertical furnaces have gained favor because they present a number of advantages over their horizontal predecessors. These advantages include: elimination of cantilever or soft-landing since the wafers are held in a quartz boat which does not touch the process tube walls; wafers can be loaded and unloaded automatically; and, the clean room footprint of the system is somewhat smaller than that of the conventional horizontal configuration. Vertical semiconductor furnaces of the type mentioned above employ a quartz tube which typically has a polysilicon coating when used for a deposition or annealing process. The polysilicon deposition reduces the power loss due to quartz reflection or radiation, and reduces the degradation of a boat occasioned by wet etching. Because semiconductor furnaces are subjected to high rates of usage and their components are exposed to harsh operating environments, periodic maintenance must be performed on various furnace components, including the quartz tube assembly.

A typical vertical furnace 10 and a typical wafer boat 20 are shown in FIGS. 1A and 1B. The wafer boat 20 is fabricated of a quartz material in order to survive the extreme high process temperature. The vertical oxidation furnace 10 is also constructed of quartz material to sustain the high process temperature of up to 1200° C. As shown in FIG. 1A, the vertical quartz furnace 10 is heated by an electrical resistance coil 12 which is capable of providing a temperature control accuracy of 0.5° C. in the operating temperature range of 300° C. ~1200° C. The wafer boat 20, shown in FIG. 1B is frequently constructed of a top plate 14, a bottom plate 16 connected thereinbetween by vertical support posts 18 which also provides cavities for housing the wafers therein. For instance, as shown in FIG. 1B, a plurality of wafers 22 are positioned in cavities 24 which are formed by horizontal ridges 26. Since a typical eight inch wafer has a thickness of about 0.6 mm, a minimum height of cavity 24 should be about 3.5 mm in order to avoid the top surface 28 of wafer 22 being scratched by the robot blade used in loading and unloading the wafers.

In a conventional wafer oxidation process, the wafer boat 20 holds a total of 172 wafers. However, it is customary to run six batches of wafers stored in wafer cassettes of 24 wafers each, amounts to a total of 144 wafers. It has been found that at the top and at the bottom of the vertical furnace, the temperature achieved for oxidation with the boat loaded in the furnace cannot be accurately controlled. It is therefore customary to load a number of dummy wafers at the top and at the bottom of the wafer boat in order to achieve accurate temperature control on the production wafers that are loaded in the center portion of the wafer boat. For instance, it is customary to load approximately nine dummy wafers into the top portion of the wafer boat and approximately fifteen dummy wafers into the bottom portion of the wafer boat. A more effective heating, i.e., and thus more effective oxidation, can be achieved by the use of dummy wafers in the wafer boat.

While the loading of dummy wafers in the wafer boat improves the overall oxidation process for the production wafers, it does create other processing problems such as the additional time required for loading and unloading the dummy wafers. In order to save time for such loading/unloading, it is preferred to only load/unload the production wafers before/after each oxidation process while leaving the dummy wafers in their cavities. While vibrations are frequently caused in the loading/unloading of a wafer boat into the furnace, i.e., by moving on a boat elevator, it is not unusual that the dummy wafers, after repeated cycles of loading/unloading, are shifted out of their cavity and thus presenting a serious problem during the upward/downward movement of the wafer boat in the furnace. The dummy wafers may either suffer breakage or cause serious damages to the furnace or the wafer boat.

SUMMARY OF THE INVENTION

In accordance with the present invention, a wafer boat that has improved wafer holding capability and a method for loading dummy wafers into a wafer boat without wafer sliding-out problems are provided.

In a preferred embodiment, a wafer boat for holding wafers during processing in a vertical furnace can be provided which includes a top plate and a bottom plate connected together by four spaced-apart, vertically extending support posts, the four spaced-apart support posts are arranged in a circumference and consist of two outer support posts positioned juxtaposed to an inlet of the wafer boat and two inner support posts positioned away from the inlet of the wafer boat, the four spaced-apart support posts are further arranged in a circumference of the wafer boat; a plurality of cavities horizontally disposed each for supporting a wafer therein, each of the plurality of cavities being formed by a horizontal notch in one of the two inner support posts facing a center of the wafer boat, and a horizontal ridge integrally formed with one of the two outer support posts extending radially inwardly toward a center of the wafer boat and circumferentially outwardly toward the inlet of the wafer boat; and a raised portion extending upwardly from a top surface of each of the horizontal ridge adjacent to the inlet of the wafer boat for preventing a wafer from sliding out of one of the plurality of cavities.

In the wafer boat for holding wafers for processing in a vertical furnace, the plurality of cavities in the wafer boat is sufficient for holding 172 wafers, or sufficient for holding both production wafers and dummy wafers. The top plate, the bottom plate, the four support posts and the horizontal ridges are fabricated of quartz. The raised portion of the top surface of each of the horizontal ridges has a thickness of at least 0.2 mm, or a thickness between about 0.2 mm and about 2 mm. Each of the plurality of cavities horizontally disposed has a height between about 3 mm and about 5 mm, or a height of about 3.5 mm. The raised portion on the horizontal ridge has a thickness of about 0.2 mm.

The present invention is further directed to a method for loading dummy wafers into a wafer boat without sliding-out problem which can be carried out by the operating steps of providing a wafer boat that has a plurality of cavities horizontally disposed therein each adapted for supporting a wafer; the wafer boat includes a top plate and a bottom plate connected together by four spaced-apart, vertically extending support posts, the support posts are arranged in a circumference and consist of two outer support posts positioned juxtaposed to an inlet of the wafer boat and two inner support posts positioned away from the inlet of the wafer boat; each of the plurality of cavities is formed by an horizontal notch in one of the two inner support posts facing a center of the wafer boat, and a horizontal ridge integrally formed with one of the two outer support posts extending radially inwardly toward the center of the wafer boat and circumferentially outwardly toward the inlet of the wafer boat; and a raised portion extending upwardly from a top surface of each of the horizontal ridge adjacent to the inlet of the wafer boat for preventing a dummy wafer from sliding out of one of the plurality of cavities; extending a dummy wafer supported on a robot blade into one of the plurality of cavities; lowering the robot blade to position the dummy wafer in one of the plurality of cavities with an edge of the dummy wafer positioned radially inside the raised portion on the top surface of the horizontal ridge; and withdrawing the robot blade from one of the plurality of cavities.

The method for loading dummy wafers into a wafer boat without sliding-out problem may further include the step of raising the wafer boat into a furnace or conducting an oxidation reaction and lowering the wafer boat to remove oxidized production wafers without having to remove or reload the dummy wafers. The method may further include the step of providing the raised portion on the horizontal ridge in a thickness between about 0.2 mm and about 2 mm. The method may further include the step of providing the plurality of cavities horizontally disposed each has a height between about 3 mm and about 5 mm. The method may further include the step of providing the wafer boat in a quartz material, or the step of loading at least 5 dummy wafers into each of top and bottom cavities in the wafer boat. The method may further include the steps of loading 9 dummy wafers into a top portion of the wafer boat and loading 15 dummy wafers into a bottom portion of the wafer boat. The method may further include the step of loading at least 144 production wafers into the wafer boat prior to conducting an oxidation reaction.

It is therefore an object of the present invention to provide a wafer boat for holding dummy wafers in repeated oxidation processes without the drawbacks or shortcomings of the conventional wafer boats.

It is another object of the present invention to provide a wafer boat that has improved wafer holding capability such that dummy wafers are not shifted out of their cavities after repeated loading/unloading operations.

It is a further object of the present invention to provide a wafer boat that has improved wafer holding capability wherein a raised portion is provided on horizontal ridges forming the cavities for preventing the wafer from sliding out.

It is another further object of the present invention to provide a wafer boat for securely holding wafers during processing in a vertical furnace that is capable of holding wafers securely in their cavities even after repeated movements into and out of a furnace.

It is still another object of the present invention to provide a wafer boat for securely holding wafers during processing in a vertical furnace wherein wafer cavities are formed by horizontal notches in support posts and horizontal ridges formed with support posts.

It is yet another object of the present invention to provide a wafer boat that has improved wafer holding capability that is capable of sustaining processing temperatures as high as 1200° C.

It is still another further object of the present invention to provide a wafer boat that has improved wafer holding capability which is fabricated of a quartz material.

It is yet another further object of the present invention to provide a wafer boat that has improved wafer holding capability that can hold at least 144 production wafers and 24 dummy wafers therein.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a wafer boat for securely holding wafers during processing in a vertical furnace by providing a raised portion on horizontal ridges that forms the wafer cavity in the boat such that any possible sliding-out of the wafer can be stopped by the raised portion. A suitable type of raised portion with about 0.2 mm, or in a range between about 0.2 mm and about 2 mm.

The wafer boat is constructed by a top plate and a bottom plate connected together by a four spaced-apart, vertically extending support posts, a plurality of cavities horizontally disposed each for receiving a wafer therein, each of the cavities is formed by a horizontal notch in one of two inner support posts and a horizontal ridge integrally formed with one of the two outer support posts extending radially inwardly toward the center of the wafer boat and further extending circumferentially outward toward the inlet of the wafer boat, and a raised portion extending upwardly from a top surface of each of the horizontal ridge adjacent to the inlet of the wafer boat for preventing a wafer from sliding out of one of the plurality of cavities.

Figure 1A:
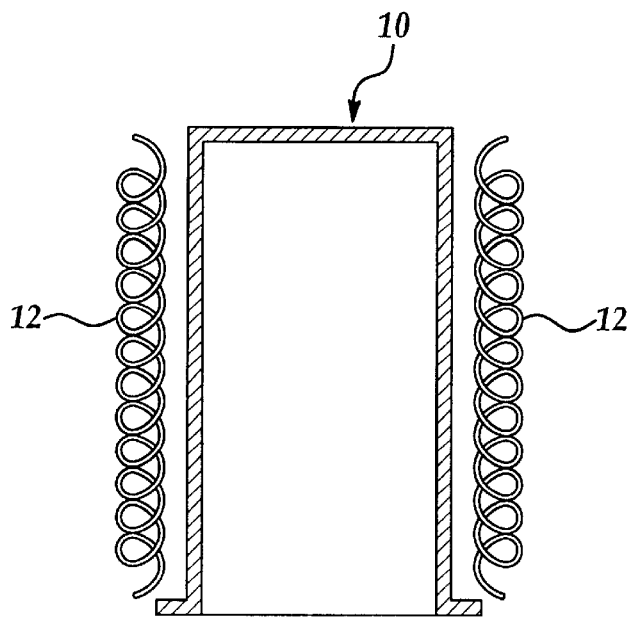
FIG. 1A is a cross-sectional view of a conventional vertical furnace.
Figure 1B:
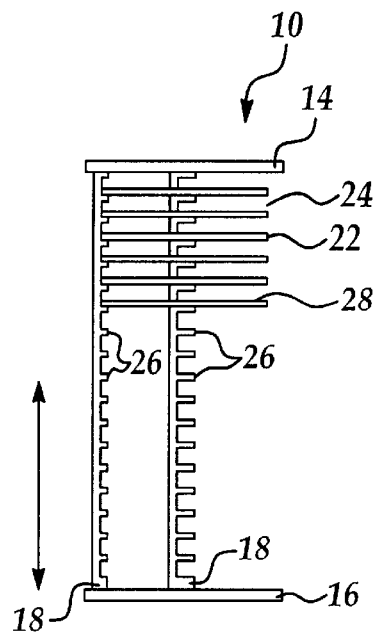
FIG. 1B is a cross-sectional view of a conventional wafer boat with wafers installed therein.
Figure 2:
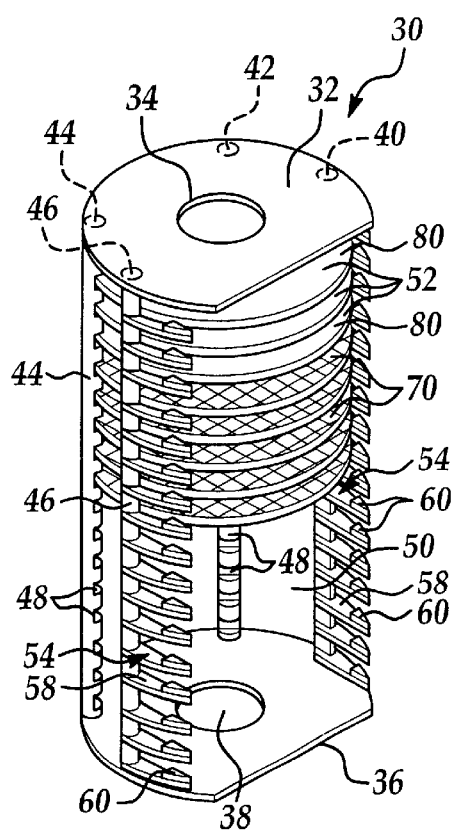
FIG. 2 is a perspective view of a present invention wafer boat that has improved wafer holding capability.

Referring now to FIG. 2, wherein a present invention wafer boat 30 is shown. The wafer boat 30 is constructed by a top plate 32 which contains an aperture 34 therein for improving the flow of heat, a bottom plate 36 which contains a similar aperture 38 therein. The top plate 32 and the bottom plate 36 are connected together by a plurality of support posts 40, 42, 44 and 46. The support posts 42,44 are inner support posts which are positioned away from the inlet 50 for the wafer boat 30. The support posts 40,46 are outer support posts which are positioned juxtaposed to the inlet 50. The 4 support posts are arranged in a circumference for the wafer boat 30. In the two inner support posts 42,44, horizontal notches are provided with one for each cavity 52 formed by the horizontal notches 48. The two outer support posts 40,46 are each provided with a horizontal ridge 54 integrally formed with the outer support posts 40,46. The horizontal ridge 54 extends radially inwardly toward a center of the wafer boat and circumferentially outwardly toward the inlet 50 of the wafer boat 30. A raised portion 60 that extends upwardly from a top surface 58 from each of the horizontal ridge 54 at a location that is immediately adjacent to the inlet 50 of the wafer boat 30. The raised portion 60 effectively prevents a wafer, i.e. a production wafer 70 or a dummy wafer 80 from sliding out of the cavities 52.

Figure 3:
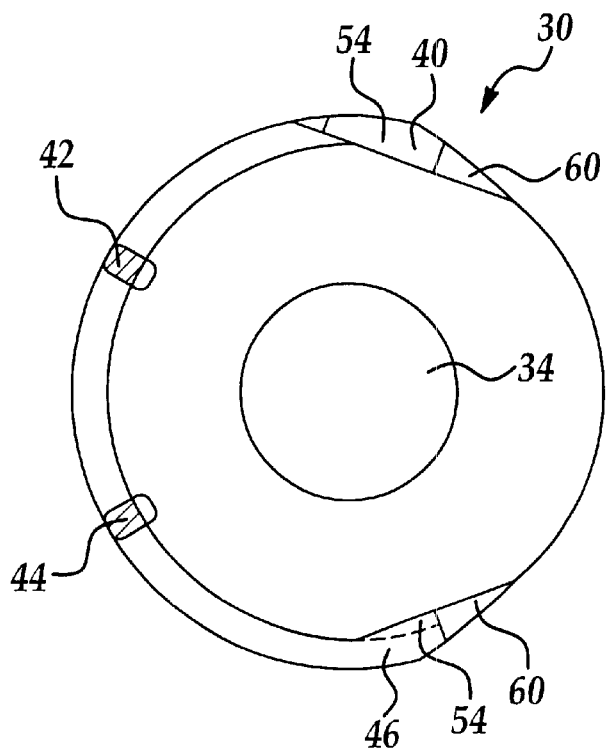
FIG. 3 is a plane view of the present invention wafer boat consists of raised portions on the horizontal bridges.

A plane view of the present invention wafer boat 30 is shown in FIG. 3 which further illustrates the raised portion 60 on top of the horizontal ridge 54 that is integrally formed with the outer support posts 40,46. It should be noted that, a suitable thickness for the raised portion 60 is between about 0.2 mm and about 2 mm, and preferably between about 0.2 mm and about 0.5 mm. The word "about" used in the context of this writing means a range of values that are ±10% of the value given. For instance, about 0.5 mm means a range of between 0.45 mm and 0.55 mm.

Figure 4:
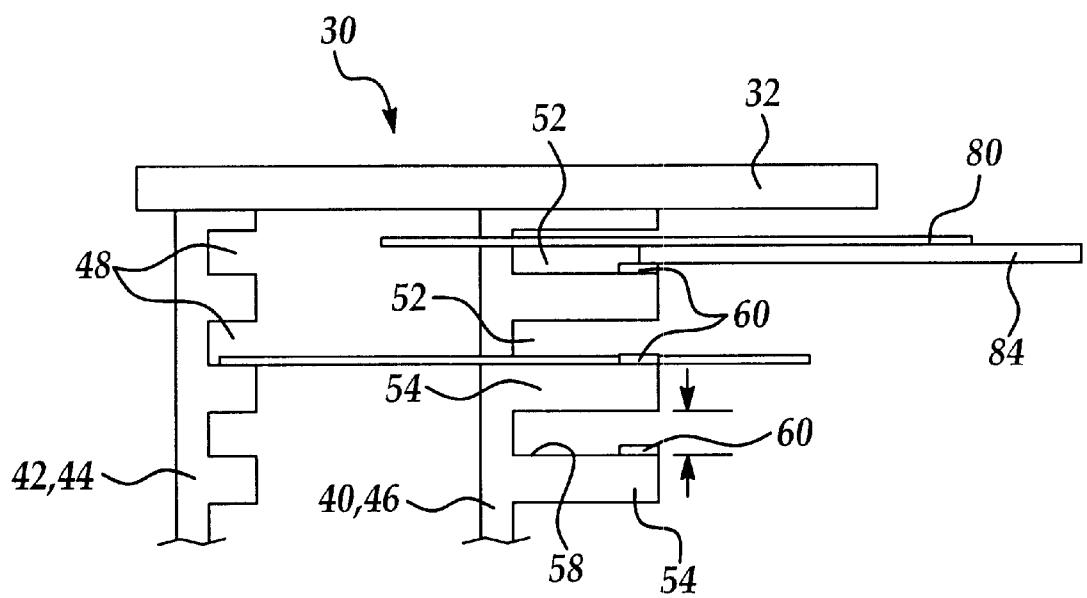
FIG. 4 is a partial, enlarged cross-sectional view of the present invention wafer boat equipped with the raised portions on the horizontal ridges.

FIG. 4 shows a partial, cross-sectional view of the present invention wafer boat 30, and specifically the top plate 32, the support posts 40, 42, 44 and 46 and the horizontal ridges 54. A quartz robot blade 84 is used to load a dummy wafer into cavity 52 by first lifting the wafer 80 into the cavity 52 and then dropping the wafer 80 by lowing the quartz blade 84. The wafer 80 when positioned in cavity 54 is situated such that an edge of the wafer 80 is positioned radially inside the raised portion 60 so that any possible outward, sliding movement of the wafer 80 from the cavity 52 is prevented. This can be more easily seen in the perspective view in FIG. 2. To remove the dummy wafers 80 or the production wafers 70 from the cavities 54, a wafer blade is first extended into cavity 54 to support the bottom surface of the wafer. The wafer blade then moves upwardly to lift the wafer 70,80 above the raised portion 60 so that it does not present a blockage to the outward movement of wafer 70,80.

For a wafer that has a typical thickness of about 0.5 mm, i.e. of a typical eight inch wafer, a quartz blade that has a typical thickness of 2.2 mm is used to place a wafer into a cavity that has a height of typically 3.5 mm. These dimensions are shown in FIG. 4.

The present invention novel wafer boat for securely holding wafers therein during processing in a vertical furnace and a method for loading dummy wafers into a wafer boat without having to remove/reload dummy wafers for each oxidation process have therefore been amply described in the above descriptions and in the appended drawings of FIGS. 2, 3, and 4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A wafer boat for holding wafers during processing in a vertical furnace comprising:

a top plate and a bottom plate connected together by four spaced-apart vertically extending support parts, said four spaced-apart support posts are arranged in a circumference and consist of two outer support posts positioned juxtaposed to an inlet of said wafer boat and two inner support posts positioned away from said inlet of said wafer boat, a plurality of cavities horizontally disposed each for receiving a wafer therein, each of said plurality of cavities being formed by a horizontal notch in one of said two inner support posts facing a center of said wafer boat, and a horizontal ridge integrally formed with one of said two outer support posts extending radially inwardly toward a center of said wafer boat and circumferentially outwardly toward said inlet of the wafer boat, and a raised portion extending upwardly from a top surface of each of said horizontal ridges adjacent to said inlet of said wafer boat for preventing a wafer from sliding out of one of said plurality of cavities.

2. A wafer boat for holding wafers during processing in a vertical furnace according to claim 1, wherein said plurality of cavities in said wafer boat sufficient for holding 172 wafers.

3. A wafer boat for holding wafers during processing in a vertical furnace according to claim 1, wherein said plurality of cavities in said wafer boat being adopted for holding both production wafers and dummy wafers.

4. A wafer boat for holding wafers during processing in a vertical furnace according to claim 1, wherein said top plate, said bottom plate, said four support posts and said horizontal ridges are fabricated of quartz.

5. A wafer boat for holding wafers during processing in a vertical furnace according to claim 1, wherein said raised portion on said top surface of each of said horizontal ridges has a thickness of at least 0.2 mm.

6. A wafer boat for holding wafers during processing in a vertical furnace according to claim 1, wherein said raised portion on said top surface of each of said horizontal ridges has a thickness between about 0.2 mm and about 2 mm.

7. A wafer boat for holding wafers during processing in a vertical furnace according to claim 1, wherein each of said plurality of cavities horizontally disposed has a height between about 3 mm and about 5 mm.

8. A wafer boat for holding wafers during processing in a vertical furnace according to claim 1, wherein each of said plurality of cavities horizontally disposed has a height of about 3.5 mm, said raised portion on said horizontal ridge has a thickness of about 0.2 mm.

9. A method for loading dummy wafers into a wafer boat without sliding out problem comprising the steps of:

providing a wafer boat having a plurality of cavities horizontally disposed therein each adapted for supporting a wafer;

said wafer boat comprises a top plate and a bottom plate connected together by four spaced-apart, vertically expending support posts, said support posts are arranged in a circumference and consist of two outer support posts positioned juxtaposed to an inlet of said wafer boat and two inner support posts positioned away from said inlet of said wafer boat;

each of said plurality of cavities being formed by a horizontal notch in one of said two inner support posts positioned away from said inlet of said boat;

each of said plurality of cavities being formed by a horizontal notch in one of said two inner support posts facing a center of said wafer boat, and a horizontal ridge integrally formed with one of said two outer support posts extending radially inwardly toward said center of the wafer boat and circumferentially outwardly toward said inlet of the wafer boat;

a raised portion extending upwardly from a top surface of each of said horizontal ridge adjacent to said inlet of the wafer boat for preventing a dummy wafer from sliding out of one of said plurality of cavities;

lowering said robot blade to position said dummy wafer in one of said plurality of cavities with an edge of the dummy wafer positioned radially inside said raised portion on said top surface of the horizontal ridge; and withdrawing said robot blade from said one of the plurality of cavities.

10. A method for loading dummy wafers into a wafer boat without sliding out problem according to claim 9 further comprising the step of raising said wafer boat into a furnace for conducting an oxidation reaction and lowering said wafer boat to remove oxidized production wafers without having to remove or reload said dummy wafers.

11. A method for loading dummy wafers into a wafer boat without sliding out problem according to claim 9 further comprising the step of providing said raised portion on said horizontal ridge in a thickness between about 0.2 mm and about 2 mm.

12. A method for loading dummy wafers into a wafer boat without sliding out problem according to claim 9 further comprising the step of providing said plurality of cavities horizontally disposed each having a height between about 3 mm and about 5 mm.

13. A method for loading dummy wafers into a wafer boat without sliding out problem according to claim 9 further comprising the step of providing said wafer boat in a quartz material.

14. A method for loading dummy wafers into a wafer boat without sliding out problem according to claim 9 further comprising the step of loading at least five dummy wafers into each of top and bottom cavities in said wafer boat.

15. A method for loading dummy wafers into a wafer boat without sliding out problem according to claim 9 further comprising the step of loading 9 dummy wafers into a top portion of said wafer boat and loading 15 dummy wafers into a bottom portion of said wafer boat.

16. A method for loading dummy wafers into a wafer boat without sliding out problem according to claim 9 further comprising the step of loading at least 144 production wafers into said wafer boat prior to conducting an oxidation reaction.

* * * * *